United States Patent
Gathman et al.

(10) Patent No.: US 9,991,875 B2
(45) Date of Patent: Jun. 5, 2018

(54) RECONFIGURABLE RADIO FREQUENCY (RF) BANDSTOP/INTERMEDIATE FREQUENCY (IF) BANDPASS FILTER

(71) Applicant: QUALCOMM Incorporated, San Diego, CA (US)

(72) Inventors: Timothy Donald Gathman, San Diego, CA (US); Ojas Choksi, San Diego, CA (US); Aleksandar Miodrag Tasic, San Diego, CA (US); Sasha Vujcic, San Diego, CA (US); Chirag Dipak Patel, San Diego, CA (US); Wu-Hsin Chen, San Diego, CA (US); Klaas Van Zalinge, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/352,402

(22) Filed: Nov. 15, 2016

(65) Prior Publication Data
US 2018/0048293 A1    Feb. 15, 2018

Related U.S. Application Data

(60) Provisional application No. 62/374,182, filed on Aug. 12, 2016.

(51) Int. Cl.
*H03F 3/19*    (2006.01)
*H04W 88/08*    (2009.01)
(Continued)

(52) U.S. Cl.
CPC .......... *H03H 11/0427* (2013.01); *H03F 3/19* (2013.01); *H03F 2200/294* (2013.01);
(Continued)

(58) Field of Classification Search
CPC ........ H03H 11/0427; H03H 2011/0488; H03F 3/19; H03F 2200/294; H03F 2200/451; H04L 5/0041; H04W 88/08
(Continued)

(56) References Cited

U.S. PATENT DOCUMENTS 6,862,322 B1 * 3/2005 Ewen ...................... H03F 3/087
340/855.7
7,676,211 B2    3/2010 Martin et al.
(Continued)

OTHER PUBLICATIONS

Sundstrom L., et al., "A Receiver for LTE Rel-11 and Beyond Supporting Non-Contiguous Carrier Aggregation", IEEE, Wireless Transceivers for Smart Devices, 19.5, Session 19, ISSCC 2013, pp. 336-337.
(Continued)

*Primary Examiner* — Brandon S Cole
(74) *Attorney, Agent, or Firm* — Qualcomm Incorporated/Seyfarth Shaw LLP

(57) ABSTRACT

A reconfigurable filter circuit has a first path including a transimpedance amplifier (TIA). The transimpedance amplifier has an input that receives an input current and an output that outputs a voltage. The reconfigurable filter circuit also includes a switchable feedback path. The switchable feedback path includes a first low-pass filter coupled to an output of the TIA. The switchable feedback path also includes a first switch to couple the feedback path to provide a feedback current to the first path resulting in a bandpass response in the output voltage when the switch is closed and a low-pass response in the output voltage when the switch is open.

20 Claims, 9 Drawing Sheets

(51) Int. Cl.
    *H03H 11/04*     (2006.01)
    *H04L 5/00*     (2006.01)

(52) U.S. Cl.
    CPC ............ *H03F 2200/451* (2013.01); *H03H 2011/0488* (2013.01); *H04L 5/0041* (2013.01); *H04W 88/08* (2013.01)

(58) Field of Classification Search
    USPC .. 327/52, 53, 58, 60, 62, 63, 65–69, 71, 72, 327/74, 77–81, 88, 89, 96, 105–361, 379, 327/389, 391, 560–563; 326/22–27, 326/81–87
    See application file for complete search history.

(56) References Cited

U.S. PATENT DOCUMENTS

| | | | |
|---|---|---|---|
| 8,483,647 | B2 | 7/2013 | Kaukovuori et al. |
| 8,705,752 | B2* | 4/2014 | Jiang .................. H04R 3/04 330/149 |
| 8,971,835 | B2* | 3/2015 | Dufrene ............ H03D 1/2245 375/346 |
| 9,124,246 | B2* | 9/2015 | Chang ............... H03H 11/0466 |
| 9,300,264 | B2* | 3/2016 | Suravarapu ......... H03G 3/3036 |
| 9,300,337 | B2 | 3/2016 | Tasic et al. |
| 9,673,782 | B1* | 6/2017 | Andrabi ............ H03H 11/1217 |
| 2010/0029323 | A1* | 2/2010 | Tasic .................. H03G 3/3052 455/550.1 |
| 2010/0182080 | A1* | 7/2010 | Mak ..................... H03F 1/083 330/3 |
| 2011/0124307 | A1* | 5/2011 | Balankutty .......... H04B 1/12 455/296 |
| 2012/0033769 | A1* | 2/2012 | He ..................... H04B 1/18 375/350 |
| 2013/0149983 | A1* | 6/2013 | Fahim ................. H04B 1/1027 455/326 |
| 2013/0154728 | A1* | 6/2013 | Basaran .............. H03F 1/086 329/348 |
| 2015/0280673 | A1 | 10/2015 | Tasic et al. |
| 2015/0381114 | A1* | 12/2015 | Stoeger ............... H03F 1/0261 375/219 |
| 2015/0381129 | A1* | 12/2015 | Brekelmans ......... H03G 3/18 330/254 |
| 2016/0049913 | A1* | 2/2016 | Jussila ................ H04B 1/0032 455/326 |
| 2016/0112146 | A1* | 4/2016 | Lau .................... H04B 15/06 455/323 |
| 2016/0164624 | A1* | 6/2016 | Yamauchi .......... H04B 10/0799 398/34 |

OTHER PUBLICATIONS

International Search Report and Written Opinion—PCT/US2017/042431—ISA/EPO—Oct. 20, 2017.

* cited by examiner

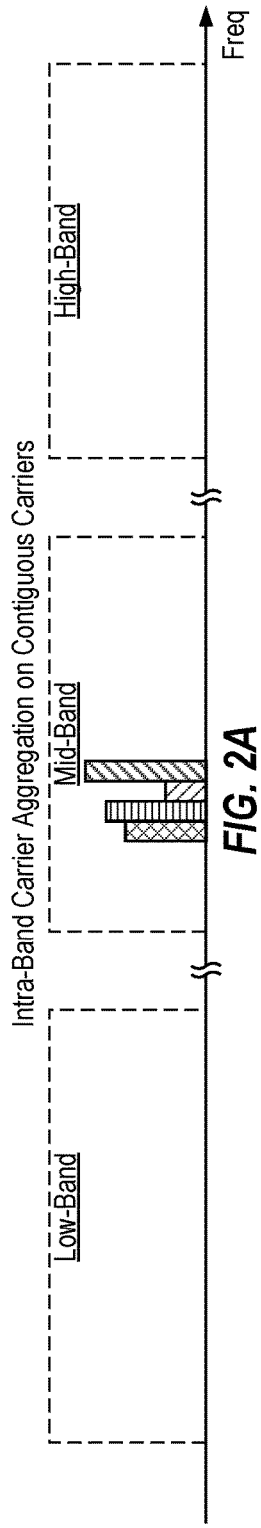
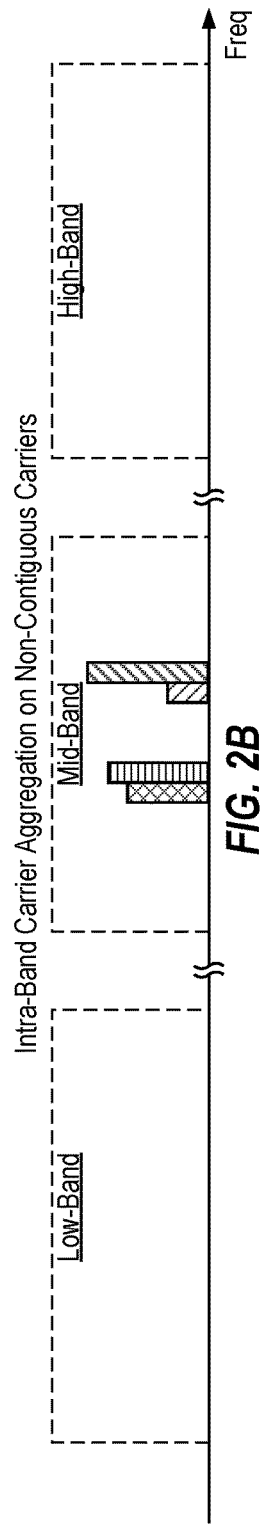
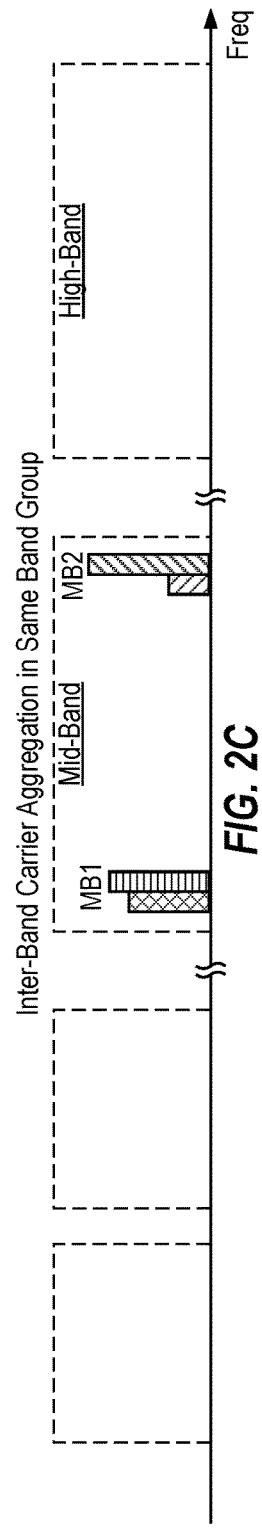
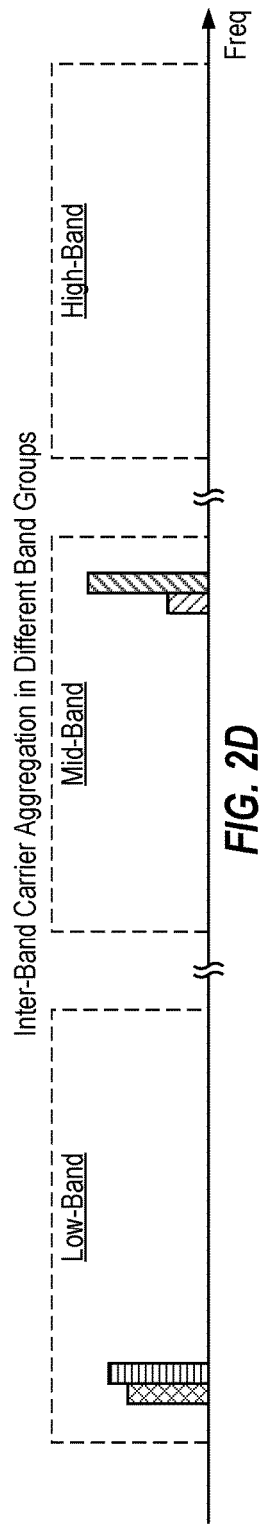
FIG. 2A  Intra-Band Carrier Aggregation on Contiguous Carriers
FIG. 2B  Intra-Band Carrier Aggregation on Non-Contiguous Carriers
FIG. 2C  Inter-Band Carrier Aggregation in Same Band Group
FIG. 2D  Inter-Band Carrier Aggregation in Different Band Groups

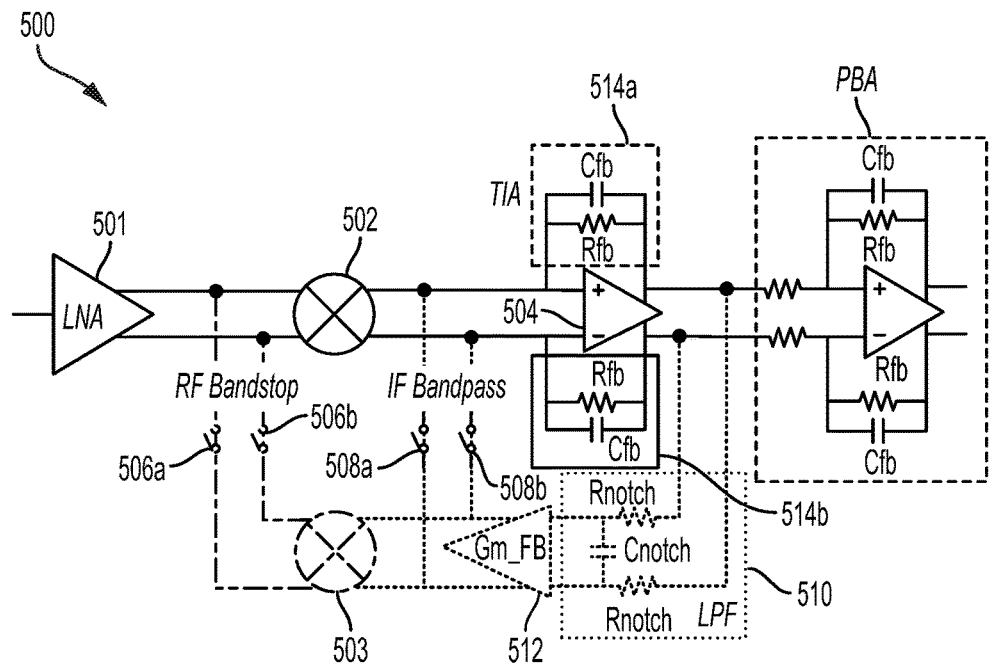
FIG. 5A
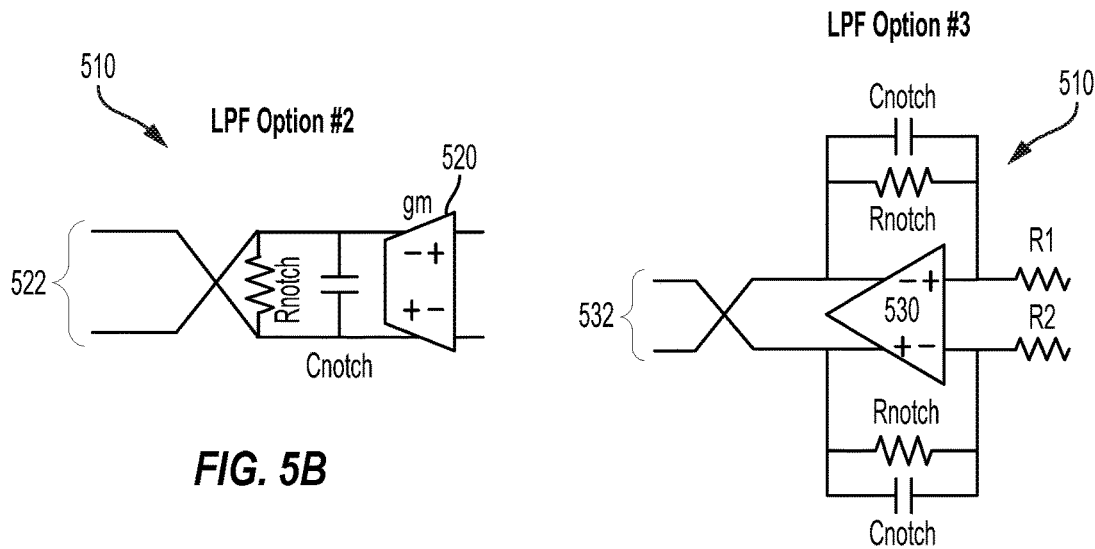
FIG. 5B
FIG. 5C

RECONFIGURABLE RADIO FREQUENCY (RF) BANDSTOP/INTERMEDIATE FREQUENCY (IF) BANDPASS FILTER

CROSS-REFERENCE TO RELATED APPLICATION

The present application claims the benefit of U.S. Provisional Patent Application No. 62/374,182, filed on Aug. 12, 2016, and titled "RECONFIGURABLE RADIO FREQUENCY (RF) BANDSTOP/INTERMEDIATE FREQUENCY (IF) BANDPASS FILTER," the disclosure of which is expressly incorporated by reference herein in its entirety.

BACKGROUND

Field

The present disclosure relates generally to wireless communication, and more specifically, to a reconfigurable radio frequency (RF) bandstop/intermediate frequency (IF) bandpass filter.

Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

Non-contiguous carrier aggregation (NCCA) architectures with two local oscillators (LOs) suffer spurious desensitization from second and third-order intermodulation products between combinations of either/both LOs and the transmitter (Tx) which fall onto one of the desired RF signals. Single-LO NCCA architectures suffer from lack of filtering early in the receive (Rx) chain and thus drop gain. The drop in gain may result in a poor noise figure (NF), degrading the Rx sensitivity and system performance.

SUMMARY

In an aspect of the present disclosure, a reconfigurable filter circuit is presented. The reconfigurable filter circuit has a first path including a transimpedance amplifier (TIA). The transimpedance amplifier has an input that receives an input current and an output that outputs a voltage. The reconfigurable filter circuit also includes a switchable feedback path. The switchable feedback path includes a first low-pass filter coupled to an output of the TIA. The switchable feedback path also includes a first switch to couple the feedback path to provide a feedback current to the first path resulting in a bandpass response in the output voltage when the switch is closed and a low-pass response in the output voltage when the switch is open.

In another aspect of the present disclosure, a method of filtering a wireless communication signal is presented. The method includes receiving a radio frequency (RF) signal in a receive path of a receive module. The receive path may include one or more components for processing the RF signal. The method also includes converting the RF signal to an intermediate frequency (IF) signal. The method additionally includes feeding back the IF signal to a first low-pass filter in negative feedback to generate a negative feedback low-pass filtered output. The method further includes generating a feedback current based on the negative feedback low-pass filtered output. Furthermore, the method includes selectively routing the feedback current to a first component of the receive path to produce a bandpass response in an output voltage when a switch in the feedback is closed and a low-pass response in the output voltage when the switch is open.

In yet another aspect of the present disclosure, a circuit for filtering a wireless communication signal is presented. The circuit includes means for receiving a radio frequency (RF) signal in a receive path of a receive module. The receive path may include one or more components for processing the RF signal. The circuit also includes means for converting the RF signal to an intermediate frequency (IF) signal. The circuit additionally includes means for feeding back the IF signal to a first low-pass filter in negative feedback to generate a negative feedback low-pass filtered output. The circuit further includes means for generating a feedback current based on the negative feedback low-pass filtered output. Furthermore, the circuit includes means for selectively routing the feedback current to a first component of the receive path to produce a bandpass response in an output voltage when a switch in the feedback is closed and a low-pass response in the output voltage when the switch is open.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

FIGS. 2A-2D show four examples of carrier aggregation, according to aspects of the present disclosure.

FIG. 5A is a circuit diagram illustrating an exemplary receive (Rx) module including a reconfigurable filter circuit in accordance with aspects of the present disclosure.

FIGS. 5B and 5C illustrate exemplary low-pass filters in accordance with aspects of the present disclosure.

DETAILED DESCRIPTION

The detailed description set forth below in connection with the appended drawings is intended as a description of exemplary embodiments and is not intended to represent the only embodiments that can be practiced. The term "exemplary" used throughout this description means "serving as an example, instance, or illustration," and should not necessarily be construed as preferred or advantageous over other exemplary embodiments. The term "couple" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

The detailed description includes specific details for the purpose of providing a thorough understanding of the exemplary embodiments. It will be apparent to those skilled in the art that the exemplary embodiments may be practiced without these specific details. In some instances, well-known structures and devices are shown in block diagram form in order to avoid obscuring the novelty of the exemplary embodiments presented herein. Other aspects, as well as features and advantages of various aspects, will become apparent to those of skill in the art through consideration of the ensuing description, the accompanying drawings and the appended claims.

Figure 1:
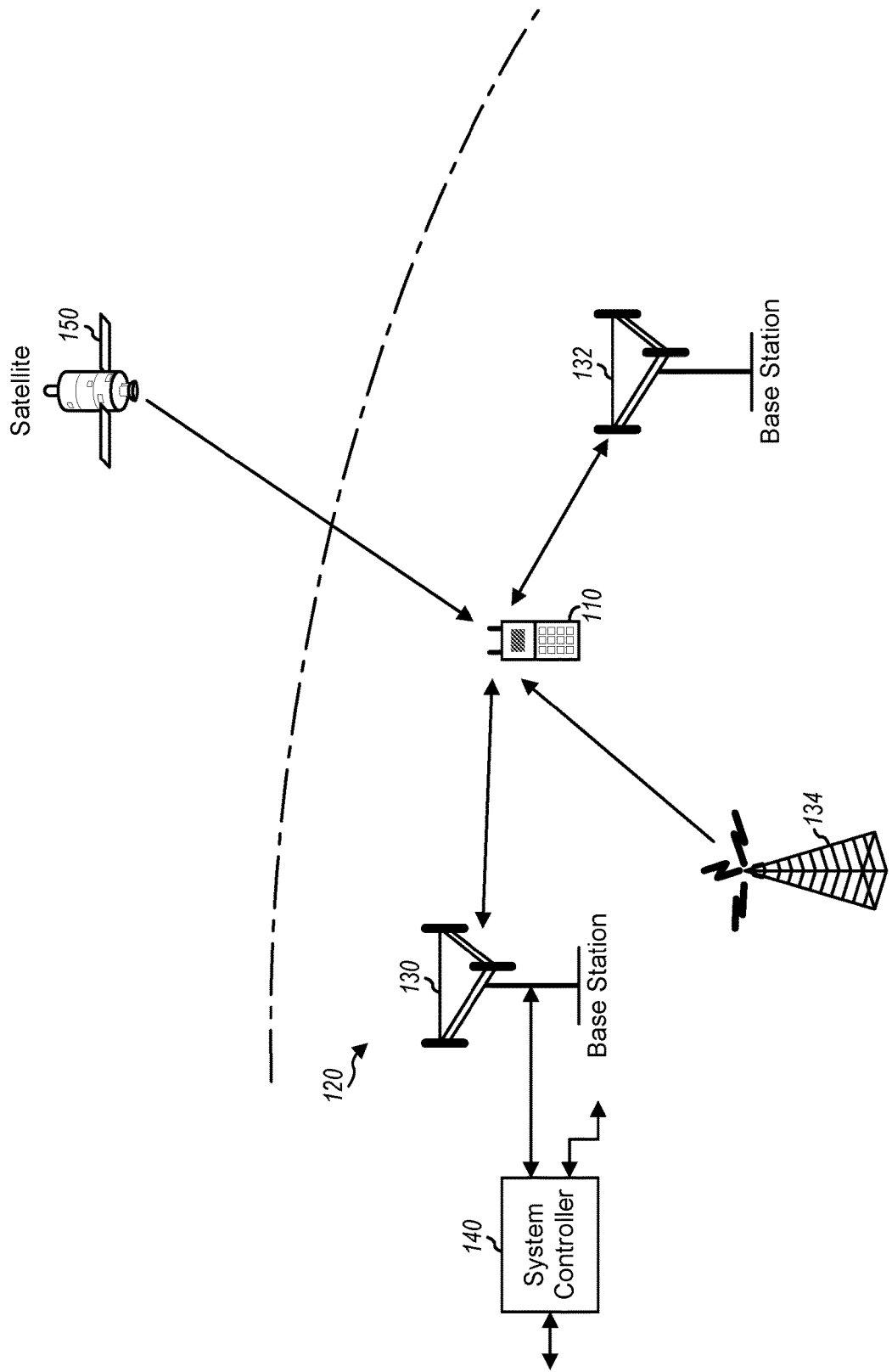
FIG. 1 shows a wireless device communicating with a wireless system, according to an aspect of the present disclosure.

FIG. 1 shows a wireless device 110 communicating with a wireless communication system 120. The wireless system 120 may be a long-term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may be capable of communicating with the wireless system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

FIG. 2A shows an example of contiguous intra-band CA. In the example shown in FIG. 2A, a wireless device (e.g., the wireless device 110) is configured with four contiguous carriers in the same band, which is a band in mid-band. The wireless device may send and/or receive transmissions on multiple contiguous carriers within the same band.

FIG. 2B shows an example of non-contiguous intra-band CA. In the example shown in FIG. 2B, a wireless device (e.g., the wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

FIG. 2C shows an example of inter-band CA in the same band group. In the example shown in FIG. 2C, a wireless device (e.g., the wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

FIG. 2D shows an example of inter-band CA in different band groups. In the example shown in FIG. 2D, a wireless device (e.g., the wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicensed spectrum (LTE-U).

Figure 3:
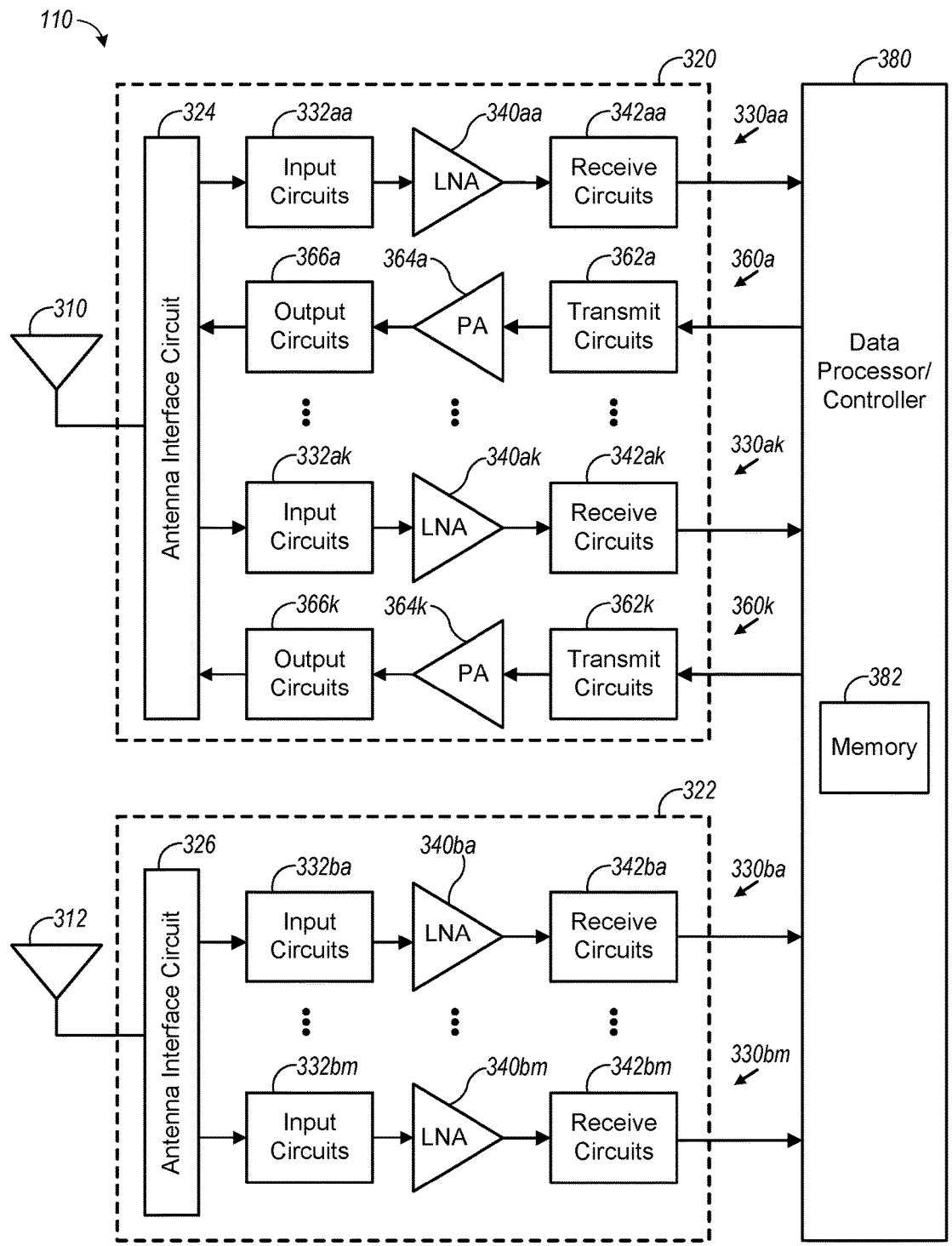
FIG. 3 shows a block diagram of the wireless device in FIG. 1, according to an aspect of the present disclosure.

FIG. 3 shows a block diagram of an exemplary design of the wireless device 110 in FIG. 1. In this exemplary design, the wireless device 110 includes a transceiver 320 coupled to a primary antenna 310, receiver 322 coupled to a secondary antenna 312, and a data processor/controller 380. The transceiver 320 includes multiple (K) receivers 330aa to 330ak and multiple (K) transmitters 360a to 360k to support multiple bands, carrier aggregation, multiple radio technologies, etc. The receiver 322 include multiple (M) receivers 330ba to 330bm to support multiple bands, carrier aggregation, multiple radio technologies, receive diversity, MIMO transmission from multiple transmit antennas to multiple receive antennas, etc.

In the exemplary design shown in FIG. 3, each receiver 330 includes input circuits 332, a low-noise amplifier (LNA) 340, and receive circuits 342. For data reception, the antenna 310 receives signals from base stations and/or other transmitter stations and provides a received radio frequency (RF) signal, which is routed through an antenna interface circuit 324 and provided to a selected receiver. The antenna interface circuit 324 may include switches, duplexers, transmit filters, receive filters, etc. The description below assumes that the receiver 330aa is the selected receiver. Within the receiver 330aa, the received RF signal is passed through input circuits 332aa, which provides an input RF signal to an LNA 340aa. Input circuits 332aa may include a matching circuit, a receive filter, etc. The LNA 340aa amplifies the input RF signal and provides an output RF signal. Receive circuits 342aa amplify, filter, and downconvert the output RF signal from RF to baseband and provide an analog input signal to a data processor 380. Receive circuits 332aa may include mixers, filters, amplifiers, matching circuits, an oscillator, a local oscillator (LO) generator, a phase locked loop (PLL), etc. Each remaining receiver 330 in the transceiver 320 and each receiver 330 in the receiver 322 may operate in similar manner as the receiver 330aa in the transceiver 320.

In the exemplary design shown in FIG. 3, each transmitter 360 includes transmit circuits 362, a power amplifier (PA) 364, and output circuits 366. For data transmission, the data processor 380 processes (e.g., encodes and modulates) data to be transmitted and provides an analog output signal to a selected transmitter. The description below assumes that transmitter 360a is the selected transmitter. Within the transmitter 360a, transmit circuits 362a amplify, filter, and upconvert the analog output signal from baseband to RF and provide a modulated RF signal. Transmit circuits 362a may include amplifiers, filters, mixers, matching circuits, an oscillator, an LO generator, a PLL, etc. A PA 364a receives and amplifies the modulated RF signal and provides a transmit RF signal having the proper output power level. The transmit RF signal is passed through output circuits 366a, routed through the antenna interface circuit 324, and transmitted via the antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of the transceiver 320 and the receiver 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Antenna interface circuits 324 and 326, input circuits 332, output circuits 366, and PAs 364 may be implemented on another module, which may be a hybrid module, etc. The circuits in the transceiver 320 and the receiver 322 may also be implemented in other manners.

The data processor/controller 380 may perform various functions for the wireless device 110. For example, the data processor 380 may perform processing for data being received via the receivers 330 and data being transmitted via the transmitters 360. The controller 380 may control the operation of antenna interface circuits 324 and 326, input circuits 332, LNAs 340, receive circuits 342, transmit circuits 362, PAs 364, output circuits 366, or a combination thereof. A memory 382 may store program codes and data for the data processor/controller 380. The data processor/controller 380 may be implemented on one or more application specific integrated circuits (ASICs) and/or other ICs.

The wireless device 110 may receive transmissions from one or more base stations/cells on multiple carriers at different frequencies for carrier aggregation. For intra-band CA, the transmissions are sent on different carriers in the same band. For inter-band CA, the transmissions are sent on multiple carriers in different bands.

Reconfigurable RF Bandstop/IF Bandpass Filter

Aspects of the present disclosure are directed to a reconfigurable filter circuit. The reconfigurable filter circuit may be controlled to selectively configure a radio frequency (RF) bandstop or intermediate frequency (IF) bandpass filter for facilitating carrier aggregation (CA), such as non-contiguous carrier aggregation. In some aspects, the reconfigurable filter may achieve filtering either directly after or preceding down conversion to baseband. Because filtering may be performed earlier in the chain (e.g., the Rx chain of a wireless transceiver), gain and noise figure may be preserved, thus maintaining Rx sensitivity. In addition, the reconfigurable filter circuit may reduce jammers, thus improving signal path linearity (e.g., receive front end (RxFE) linearity).

Figure 4A:
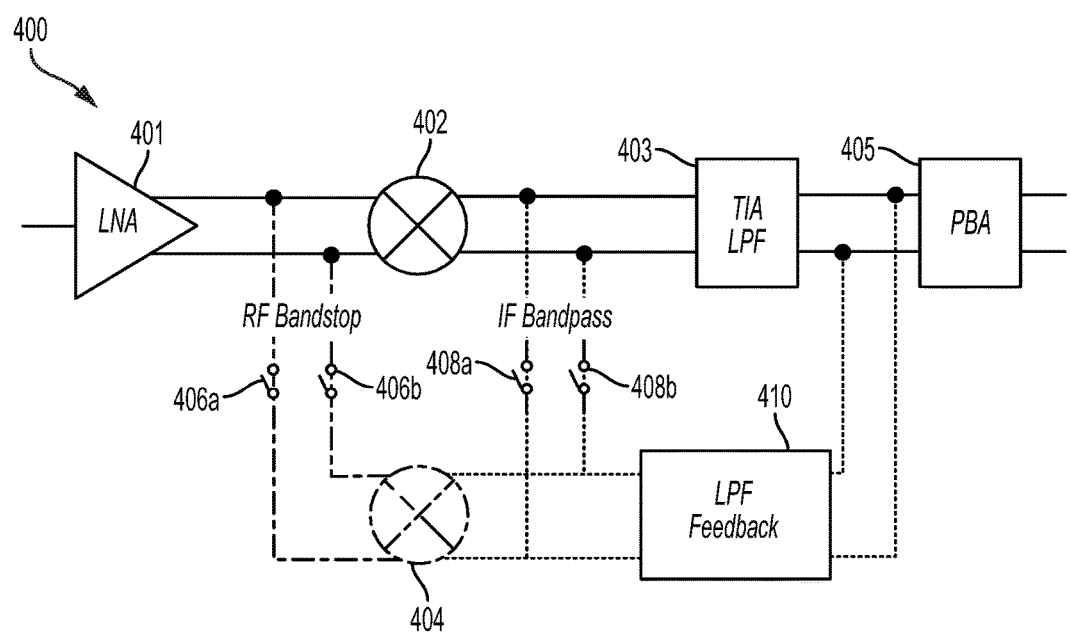
FIG. 4A is a block diagram illustrating an exemplary receive (Rx) module including a reconfigurable filter circuit in accordance with aspects of the present disclosure.

FIG. 4A is a block diagram illustrating an exemplary receive (Rx) module 400 including a reconfigurable filter circuit in accordance with aspects of the present disclosure. Although the circuitry and components of the exemplary Rx module 400 are shown with differential connections and inputs, this is merely exemplary and not limiting. The RX module 400 and reconfigurable filter circuits of the present disclosure may also be configured for single-ended connections.

Referring to FIG. 4A, the Rx module 400 comprises a first path (e.g., a receive path) including a low-noise amplifier (LNA) 401, a mixer 402, a transimpedance amplifier (TIA) block 403, and a programmable baseband amplifier (PBA) block 405. The Rx module 400 is also configured with a negative feedback low-pass filter (LPF) 410 and a second mixer 404 in the feedback path. The feedback path may be reconfigured under the control of switches 406a, 406b and switches 408a, 408b. In some aspects, the switches 406a, 406b and 408a, 408b may be controlled via a modem or jammer detector, or other control circuitry, for example. In some aspects, the switches may be digitally controlled such that digital controls for the switches are enabled for different frequency bands or gain modes. By controlling the switches, the Rx module 400 may be configured for IF operation or RF operation. In some aspects, the feedback path may be configured to disable legacy zero intermediate frequency (ZIF) operation and enable low intermediate frequency (LIF) operation. Furthermore, the feedback path may be configured to provide a bandpass response (e.g., RF bandstop or IF bandpass operation) around the TIA block 403 for improved performance including, but not limited to non-contiguous carrier aggregation (NCCA) spur reduction or mitigation.

In one example, when switches 406a, 406b are open and switches 408a, 408b are closed, the feedback path may be configured to provide the output of the negative feedback low-pass filter 410 to the input of the TIA block 403. In this configuration, the second mixer 404 is disabled and the Rx module 400 is configured for IF operation. As such, the LNA 401 receives a RF input signal. The RF signal may, for example, include multiple non-contiguous carriers. The LNA 401 amplifies the RF input signal. The output of the LNA 401 is supplied to the mixer 402, which downconverts the amplified RF signal and outputs an IF signal. The IF signal is supplied to the TIA block 403. The TIA block 403 amplifies and low-pass filters the IF signal. The output of the TIA block 403 is supplied to the PBA block 405.

Unlike conventional Rx modules, the output of the TIA block 403 is also supplied via the feedback loop to the low-pass filter (LPF) feedback block and is low-pass filtered. Because the LPF feedback block is in negative feedback, the low-pass filtered output is a high pass frequency response. The low-pass filtered output is fed back to the TIA block 403. The low-pass filtered output is in turn subjected to low-pass filtering via the low-pass filter of the TIA block 403. This produces a bandpass response at the output of the TIA block 403. This is in contrast to conventional architectures that produce a low-pass response via the TIA block 403.

On the other hand, when switches 408a, 408b are open (e.g., disabled) and switches 406a, 406b are closed (e.g., enabled), the feedback loop may be extended to include additional components of the Rx chain. As shown in the example of FIG. 4A, the feedback loop may be extended to include the mixer 402. Similarly, the feedback loop could be further extended to include the LNA 401 or other components (not shown) of the Rx chain. For example, switches 406a, 406b or additional switches (not shown) could be coupled between the mixer 404 and the input of the LNA 401. In this way, the Rx module components included within the loop may be protected from a jammer. Here, the mixer 402 is also protected from the jammer along with the PBA block 405. In this case, the Rx module 400 is configured for RF operation and the output of the negative feedback LPF 410 is upconverted via the mixer 404 to produce an RF signal supplied to the mixer 402. The application of the LPF 410 coupled to the TIA block 403 produces a bandpass response at the output of the TIA block 403 and a bandstop response in the RF section, e.g., before the mixer 402.

Figure 4B:
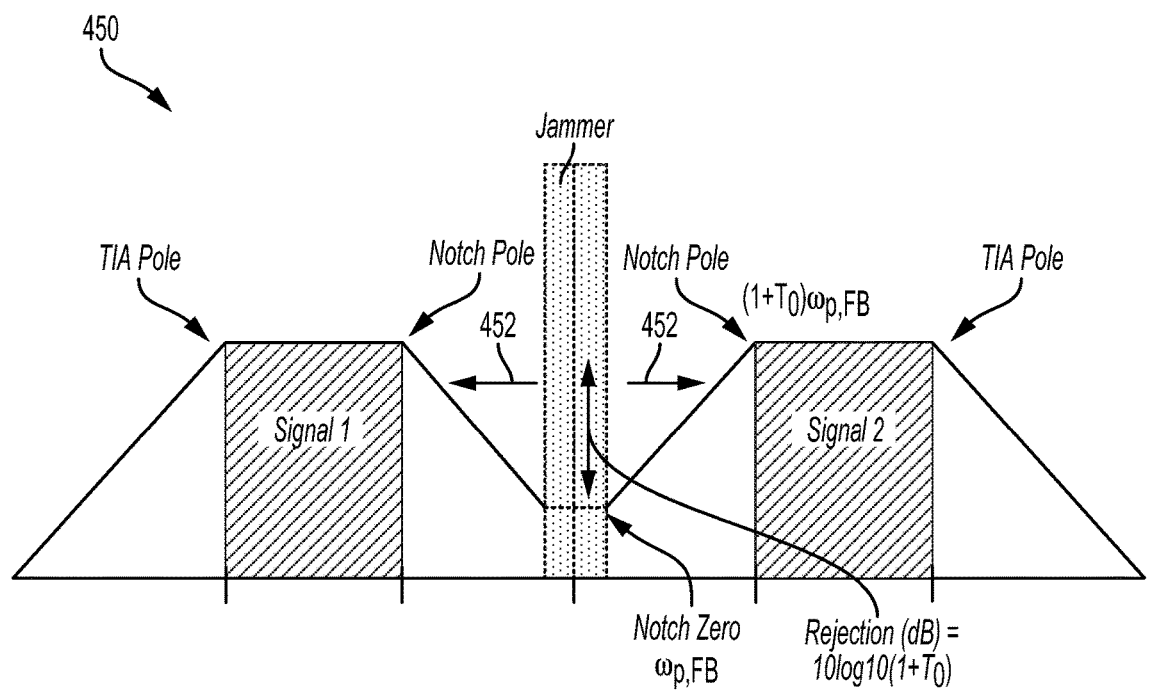
FIG. 4B illustrates an example IF bandpass/RF bandstop response in accordance with aspects of the present disclosure.

FIG. 4B is a diagram 450 illustrating an example IF bandpass/RF bandstop response in accordance with aspects of the present disclosure. As shown by way of example in FIG. 4B, the combination of the two low-pass filters (e.g., LPF 410 and the LPF of the TIA block 403) creates a notch 452 in the response. The notch 452 may be defined based on the pole of the feedback LPF ($\omega_{p,FB}$) 410 and the loop (e.g., as configured according to the state of switches 406a, 406b, 408a, and 408b) gain in the feedback path $T_o$. The bandwidth of the overall response may be defined based on the pole of the transimpedance amplifier (TIA block 403). As such, the bandpass filter that results from the combination of the low-pass filter of the TIA block and the negative feedback low-pass filter (LPF) 410 may be configured such that after Rx down conversion carrier Signal 1 (e.g., which may include negative frequencies) and carrier Signal 2 (e.g., which may include positive frequencies) fall at the peaks of the bandpass response. On the other hand, the jammer is between the two non-contiguous carriers (e.g., centered at $f_0$ at RF and downconverted to f=0) and may be rejected. Accordingly, the programmable baseband amplifier (PBA) block may be protected from jammers and receive (Rx) sensitivity may be preserved.

The radio frequency (RF) bandstop response is similar, and in some aspects, may be the same as the intermediate frequency (IF) bandpass response. This is because the notch 452 in the response is likewise defined based on the pole of the feedback LPF ($\omega_{p,FB}$) and the loop gain $T_0$.

FIG. 5A is a circuit diagram illustrating an exemplary receive (Rx) module 500 including a reconfigurable filter circuit in accordance with aspects of the present disclosure. As shown in FIG. 5A, the negative feedback low-pass filter may comprise passive components such as a resistors ($R_{notch}$) and capacitors ($C_{notch}$). The passive RC filter controls the pole of the feedback LPF ($\omega_{p,FB}$) and thus the Q-factor of the bandpass/bandstop. Of course, the circuit of FIG. 5A is merely exemplary and not limiting. Similarly, the transimpedance amplifier (TIA) is configured with a low-pass filter comprising resistors $R_{fb}$ and capacitors $C_{fb}$ in the feedback of each of the differential outputs.

The feedback path for the Rx module 500 may be reconfigured for radio frequency (RF) operation or intermediate frequency (IF) operation under the control of the switches 506a, 506b and 508a, 508b. When switches 506a, 506b are open and switches 508a, 508b are closed, the feedback path may be configured to provide the output of the negative feedback low-pass filter to the inputs of the TIA 504. The mixer 503 is disabled and the Rx module 500 is configured for IF bandpass operation. As such, a low-noise amplifier (LNA) 501 may receive an RF input signal including multiple carriers (e.g., non-contiguous carriers). The LNA 501 amplifies the RF input signal and outputs an amplified RF signal.

As shown in FIG. 5A, the Rx module 500 may be configured for differential signaling. Of course, this is merely exemplary, and the Rx module could also be implemented in a single-ended configuration. The output of the LNA 501 is supplied to the mixer 502. By way of example, but not limitation, the mixer may comprise a current mode passive mixer. The amplified RF signal is downconverted to an IF signal. The mixer 502 generates a current corresponding to the IF signal, which is supplied to the TIA 504. The TIA 504 converts the input current to a voltage that is low-pass filtered via the negative feedback low-pass filter (LPF) circuit 510. The low-pass filter circuit 510 may comprise resistor capacitor (RC) circuitry (e.g., $R_{notch}$ and $C_{notch}$). The low-pass filter circuit 510 may be coupled between the output of the TIA 504 and a transconductance amplifier 512 (e.g., may be in series with the low-pass filter circuit 510). The output of the negative feedback LPF circuit 510 is supplied to the input of the transconductance amplifier (Gm_FB) 512, which converts the voltage output of the LPF circuit 510 back to a current, for example, for input to the TIA 504. Low-pass filter circuitry 514 is also coupled in the feedback of the TIA (e.g., $R_{fb}C_{fb}$). As such, the low-pass filter circuitry 514 is applied to produce a bandpass response at the output of the TIA 504.

On the other hand, when switches 508a, 508b are open and switches 506a, 506b are closed, the feedback loop may be extended to include additional components of the Rx chain. As shown in the example of FIG. 5A, the feedback loop may be extended to include the mixer 502. In this case, the Rx module 500 is configured for RF operation and the output of the transconductance amplifier (Gm_FB) 512 is upconverted via the mixer 503 (e.g., a current-mode mixer) to produce an RF signal that is supplied to the mixer 502. The decision to feed back to IF or RF can be based on whether mixer performance or using extra current is more important. In one example, time domain division (TDD) mode versus frequency domain division (FDD) mode can control which switches are open. In another example, the received frequencies can dictate whether RF or IF feedback will occur. If there is no degradation in performance, both sets of switches can be open, meaning that feedback will stop.

FIGS. 5B and 5C illustrate additional examples of a low-pass filter (LPF) 510. The low-pass filters shown in FIGS. 5A, 5B and 5C are merely exemplary and other configurations implementations of a low-pass filter may be used. In FIG. 5B, the LPF 510 may comprise a transconductance amplifier 520 with a resistor Rnotch and capacitor Cnotch coupled in parallel with the output terminals of the transconductance amplifier 520. The output terminals of the transconductance amplifier 520 are reversed or opposite in polarity from the input terminals of the transconductance amplifier 520. As such, the transconductance amplifier 520 produces a negative gain. Accordingly, the differential output terminals 522 of the LPF 510 may be switched to maintain correct or consistent polarity with the remaining circuitry of the Rx module 500. The LPF 510 as shown in FIG. 5B is also beneficial because it has high input impedance and furthermore may be configured to produce a voltage gain. That is, with the LPF 510 shown in FIG. 5B, the loop gain may be adjusted by the transconductance amplifier 520 and resistor Rnotch, in addition to the transconductor 512 (shown in FIG. 5A). As such, the voltage gain throughout the entire loop (e.g., loop gain $T_0$) may be adjusted and thus, greater rejection may be achieved.

In FIG. 5C, the LPF 510 may comprise an operational amplifier 530 with a resistor (Rnotch) and capacitor (Cnotch) in negative feedback. The output terminals of the operational amplifier 530 are reversed or opposite in polarity from the input terminals of the operational amplifier 530. As such, the operational amplifier 530 produces a negative gain. Accordingly, the differential output terminals 532 of the LPF 510 may be switched to maintain correct or consistent polarity with the remaining circuitry of the Rx module 500. The gain of this structure may also be adjusted based on the ratio of the input resistors (e.g., R1 or R2) and Rnotch. Accordingly, the LPF 510 of FIG. 5C may be configured to produce a voltage gain such that greater rejection may be achieved.

Figure 5D:
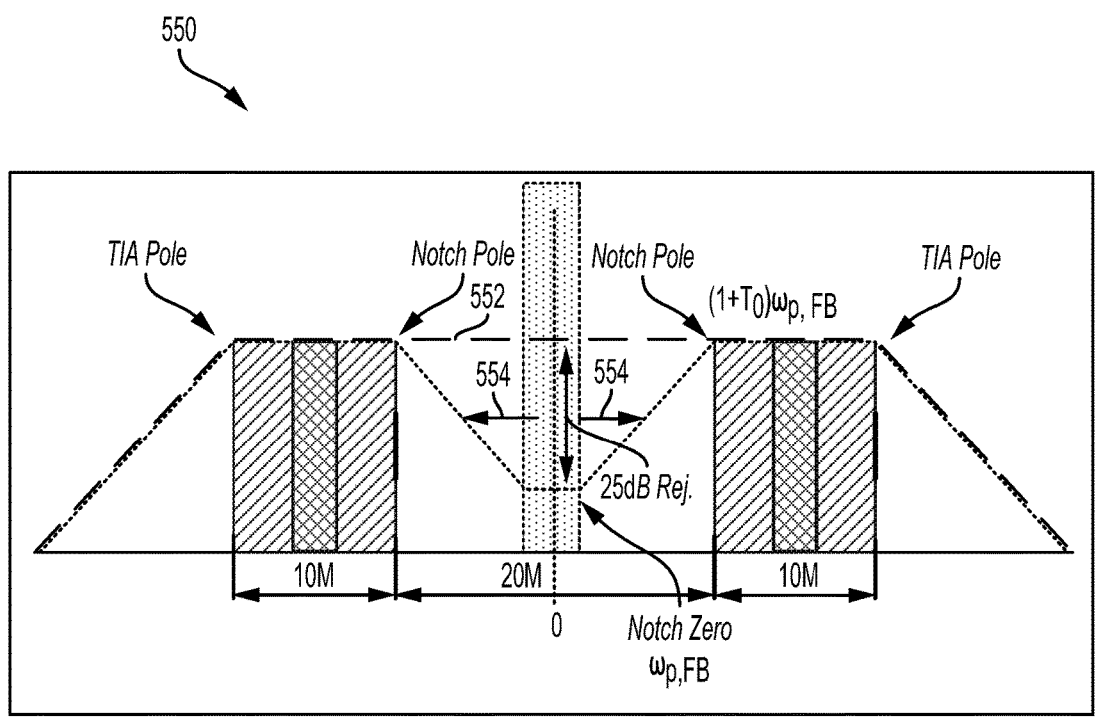
FIG. 5D is a diagram illustrating an example bandpass response in accordance with aspects of the present disclosure.

FIG. 5D is a diagram 550 illustrating an example bandpass response (e.g., IF bandpass/RF bandstop (e.g., notch) response) in accordance with aspects of the present disclosure. As shown by way of example, the TIA 504 produces a low-pass response 552 defining the bandwidth of the overall response (e.g., when the switches (506a, 506b, 508a, 508b) are open. However, using the configurable feedback (or switchable filter circuit), the output of the TIA 504 may be further subjected to the low-pass filter circuit 510 in the negative feedback and supplied back to the input of the TIA 504 via a transconductance stage (e.g., the transconductor 512) under the control of the switches (e.g., 508a, 508b). As such, the TIA 504 output voltage is coupled to the LPF 510 and the transconductor 512. In doing so, the combination of the two low-pass filters (e.g., the LPF circuit 510 coupled in the feedback of the TIA 504 and the LPF circuitry 514a, 514b) creates a notch 554 in the response. The notch 554 may be defined based on the pole of the components of the LPFs (e.g., $R_{fb}/C_{fb}$ and $R_{notch}/C_{notch}$), the transconductance ($\omega_{p,FB}$), and the loop gain $T_0$ (e.g., as configured according to the state of switches 506a, 506b, 508a, and 508b). As such, the bandpass filter that results from the combination of the low-pass filter of the TIA block and the negative feedback low-pass filter (LPF) may be configured such that the down converted carrier Signal 1 (e.g., which may include negative frequencies) and down converted carrier Signal 2 (e.g., which may include positive frequencies) fall at the peaks of the bandpass response. On the other hand, the jammer is between the two non-contiguous carriers (e.g., centered at $f_0$ at RF and downconverted to $f=0$) and may be rejected. Accordingly, the programmable baseband amplifier (PBA) block may be protected from jammers and receive (Rx) sensitivity may be preserved.

The radio frequency (RF) bandstop response is similar, and in some aspects, may be the same as the intermediate frequency (IF) bandpass response. This is because the notch 452 in the response is likewise defined based on the pole of the feedback LPF ($\omega_{p,FB}$).

Figure 6:
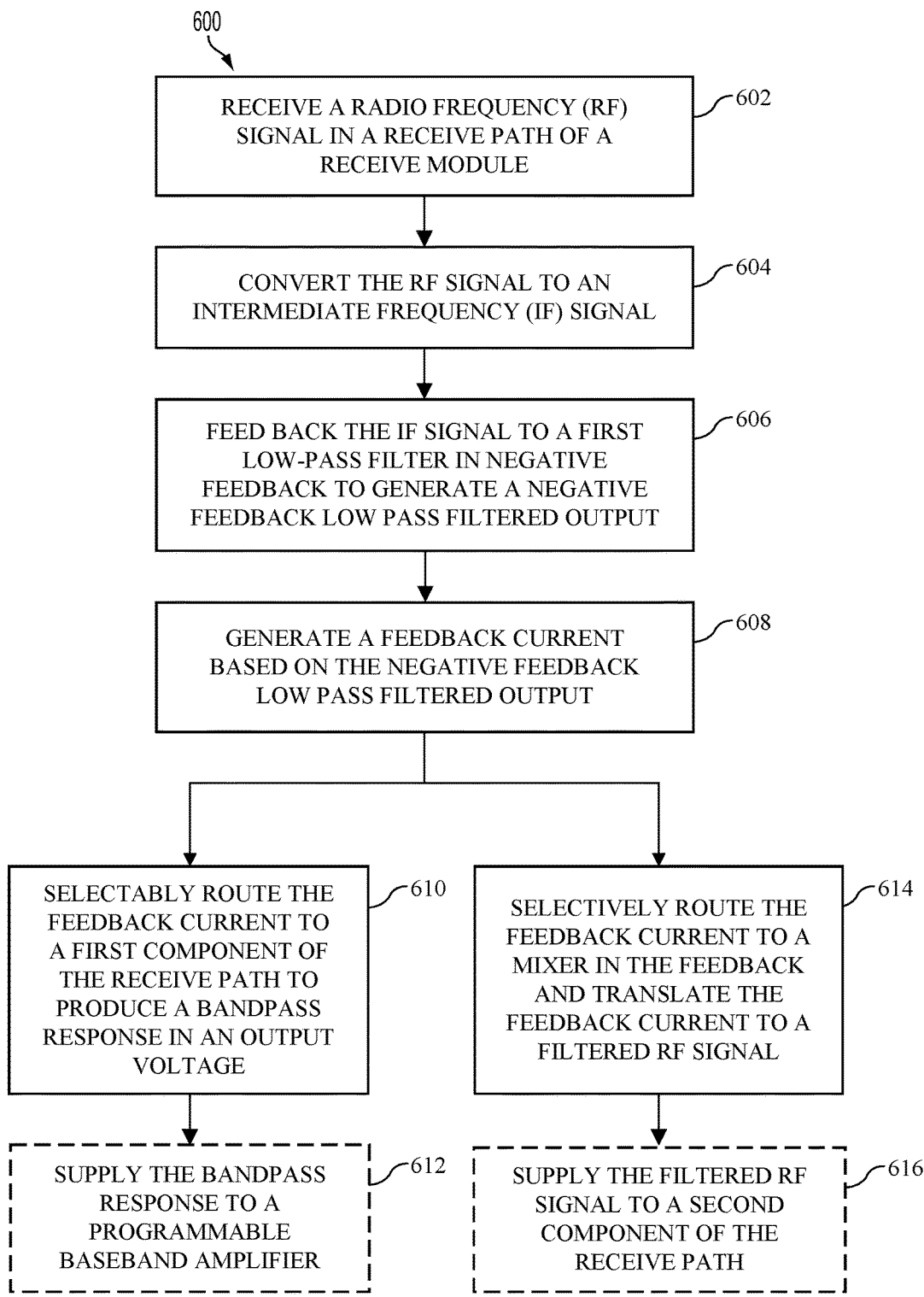
FIG. 6 is a flow diagram illustrating a method of filtering a wireless communication signal, in accordance with aspects of the present disclosure.

FIG. 6 is a flow diagram illustrating a method 600 of filtering a wireless communication signal, in accordance with aspects of the present disclosure. At block 602, the process receives a radio frequency signal in a receive path of a receive module. The receive path may include one or more components for processing the RF signal. At block 604, the process converts the RF signal to an intermediate frequency (IF) signal. At block 606, the process feeds back the IF signal to a low-pass filter in negative feedback to generate a negative feedback low-pass filtered output. At block 608, the process generates a feedback current based on the negative feedback low-pass filtered output. In some aspects, the feedback current may be generated via a transconductance amplifier or like components. At block 610, the process selectably routes the feedback current to a first component of the receive path to produce a bandpass response in an output voltage when a switch in the feedback is closed and a low-pass response in the output voltage when the switch is open. In some aspects, the routes may be switched by controlling switches in a feedback path of the receive module. The switches may be controlled based on a gain mode or a frequency band of the received RF signal or a jammer detector output, for example.

In some aspects, in block 612, the process may optionally supply the bandpass response to a programmable baseband amplifier.

In some aspects, in block 614, the process may selectively route the feedback current to a mixer in the feedback. The feedback current may be translated to a filtered RF signal. Furthermore, optionally, in block 616, the filtered RF signal may optionally be supplied (e.g., via switches 506a, 506b) to a second component of the receive path. The second component may be included in the receive path prior to the first component (e.g., LNA 501).

According to an aspect of the present disclosure, a reconfigurable filter circuit is described. The reconfigurable filter circuit includes means for receiving a radio frequency signal. The means for receiving may, for example, comprise antenna 310, antenna interface 324, input circuits 332 or LNA 340, as shown in FIG. 3, LNA shown in FIGS. 4A and 5, as well as, mixer 402, and mixer 502 shown in FIGS. 4A and 5A, respectively. The reconfigurable filter circuit may also include means for converting the RF signal to an intermediate frequency (IF) signal and means for high pass filtering the amplified signal. The converting means may, for example, comprise the mixer 402 and mixer 502 of FIGS. 4A and 5A, respectively. The reconfigurable filter circuit may include means for feeding back the IF signal to a low-pass filter in negative feedback. The means for feeding back may, for example, comprise the TIA as shown in FIGS. 4A and 5A, or switches 406a, 406b, 408a, 408b, 506a, 506b, 508a, 508b as shown in FIGS. 4A and 5A, respectively. The reconfigurable filter circuit may also include means for generating a feedback current based on the negative feedback low-pass filtered output. The generating means may, for example, comprise the transconductor 512. The reconfigurable filter circuit may also include means for selectively routing the feedback current to a first component of the receive path to produce a bandpass response in an output voltage when a switch in the feedback is closed and a low-pass response in the output voltage when the switch is open. The means for selectively routing may, for example, comprise switches 406a, 406b, 408a, 408b, 506a, 506b, 508a, 508b as shown in FIGS. 4A and 5A, respectively.

In another aspect, the aforementioned means may be any module or any apparatus configured to perform the functions recited by the aforementioned means.

Figure 7:
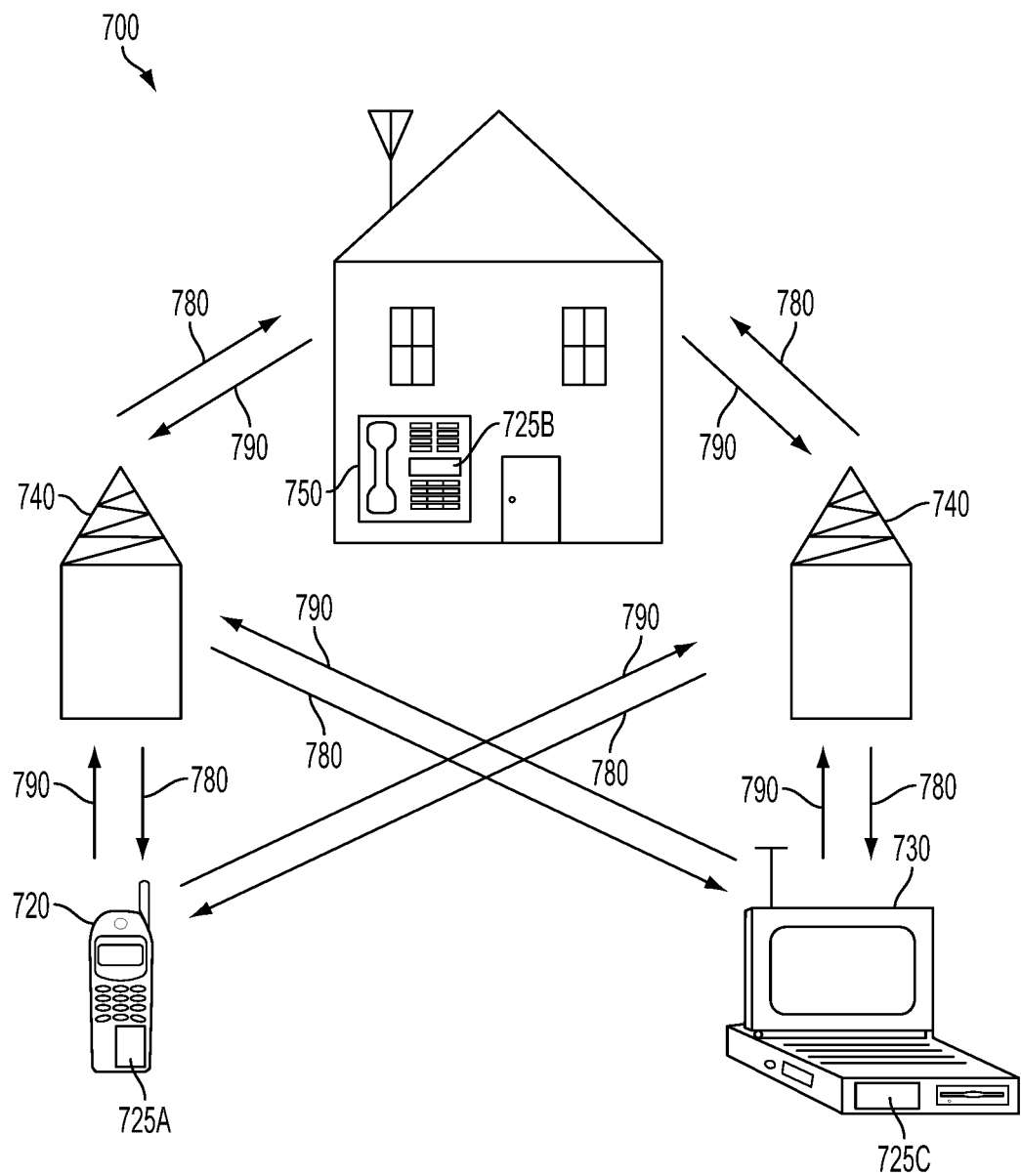
FIG. 7 is a block diagram showing an exemplary wireless communication system in which an aspect of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed reconfigurable filter circuit. It will be recognized that other devices may also include the disclosed reconfigurable filter circuit, such as the base stations, user equipment, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed reconfigurable filter circuit.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A reconfigurable filter circuit comprising:
   a first path including a transimpedance amplifier (TIA) having an input configured to receive an input current and an output configured to output a voltage; and
   a switchable feedback path including a first low-pass filter coupled to an output of the TIA, the switchable feedback path including a first switch to couple the switchable feedback path to provide a feedback current to the first path resulting in a bandpass response in the output voltage when the first switch is closed and a low-pass response in the output voltage when the first switch is open.

2. The circuit of claim 1, in which the switchable feedback path further comprises a transconductance stage coupled between the first low-pass filter and the first switch, the first switch selectively coupling an output of the transconductance stage to the input of the TIA.

3. The circuit of claim 1, further comprising a second low-pass filter coupled in feedback of the TIA.

4. The circuit of claim 1, in which the first path further includes a first mixer coupled between the output of a low-noise amplifier (LNA) and the input of the TIA.

5. The circuit of claim 4, further comprising a second switch coupling the switchable feedback path to an input of the first mixer.

6. The circuit of claim 5, further comprising a second mixer coupled between a transconductance stage and the second switch, the second switch selectively coupling the output of the transconductance stage to the input of the first mixer.

7. The circuit of claim 5, further comprising a second mixer coupled between a transconductance stage and the second switch, the second switch selectively coupling the output of the transconductance stage to the input of the LNA.

8. The circuit of claim 1, further comprising a programmable baseband amplifier (PBA) coupled to the output of the TIA.

9. A method of filtering a wireless communication signal, comprising:
   receiving a radio frequency (RF) signal in a receive path of a receive module, the receive path comprising one or more components for processing the RF signal;
   converting the RF signal to an intermediate frequency (IF) signal;
   feeding back the IF signal to a first low-pass filter in negative feedback to generate a negative feedback low-pass filtered output;
   generating a feedback current based on the negative feedback low-pass filtered output; and
   selectively routing the feedback current to a first component of the receive path to produce a bandpass response in an output voltage when a switch in the feedback is closed and a low-pass response in the output voltage when the switch is open.

10. The method of claim 9, further comprising supplying the bandpass response to a programmable baseband amplifier.

11. The method of claim 9, further comprising:
    translating the negative feedback low-pass filtered output to a filtered RF signal; and
    selectively routing the filtered RF signal to a second component of the receive path, the second component included in the receive path prior to the first component.

12. The method of claim 11, in which the translating comprises upconverting the negative feedback low-pass filtered output.

13. The method of claim 11, in which the second component comprises a low-noise amplifier (LNA).

14. The method of claim 9, in which the first component comprises a transimpedance amplifier (TIA).

15. The method of claim 9, in which the filtering comprises applying a second low-pass filter to the negative feedback low-pass filtered output.

16. A circuit for filtering a wireless communication signal, comprising:
    means for receiving a radio frequency (RF) signal in a receive path of a receive module, the receive path comprising one or more components for processing the RF signal;
    means for converting the RF signal to an intermediate frequency (IF) signal;
    means for feeding back the IF signal to a first low-pass filter in negative feedback to generate a negative feedback low-pass filtered output;
    means for generating a feedback current based on the negative feedback low-pass filtered output; and
    means for selectively routing the feedback current to a first component of the receive path to produce a bandpass response in an output voltage when a switch in the feedback is closed and a low-pass response in the output voltage when the switch is open.

17. The circuit of claim 16, further comprising means for supplying the bandpass response to a programmable baseband amplifier.

18. The circuit of claim 16, further comprising:
    means for translating the negative feedback low-pass filtered output to a filtered RF signal; and
    means for selectively routing the filtered RF signal to a second component of the receive path, the second component included in the receive path prior to the first component.

19. The circuit of claim 18, further comprising means for upconverting the negative feedback low-pass filtered output.

20. The circuit of claim 18, further comprising means for low-pass filtering the negative feedback low-pass filtered output.

* * * * *